(12) United States Patent
Johnson et al.

(10) Patent No.: US 6,424,301 B1
(45) Date of Patent: Jul. 23, 2002

(54) COMBINATION BATTERY HOLDER AND ANTENNA FOR KEYFOB

(75) Inventors: Susan Johnson, Rochester; Tejas Desai, Sterling Hghts, both of MI (US)

(73) Assignee: Siemens Vdo Automotive Corporation, Auburn Hills, MI (US)

( * ) Notice: Subject to any disclaimer, the term of this patent is extended or adjusted under 35 U.S.C. 154(b) by 0 days.

(21) Appl. No.: 09/715,732

(22) Filed: Nov. 17, 2000

Related U.S. Application Data

(60) Provisional application No. 60/186,174, filed on Mar. 1, 2000.

(51) Int. Cl.[7] .......................... H01Q 1/36; G08C 19/12; B60Q 1/00
(52) U.S. Cl. .................... 343/702; 343/895; 340/425.5; 340/426; 341/176; 455/128
(58) Field of Search .................................. 343/702, 713, 343/741, 742, 866, 867, 895; 340/425.5, 426, 644; 455/90, 100, 128; 341/173, 176

(56) References Cited

U.S. PATENT DOCUMENTS

| | | | | |
|---|---|---|---|---|
| 5,331,325 A | * | 7/1994 | Miller | 341/176 |
| 5,600,323 A | * | 2/1997 | Boschini | 341/173 |
| 5,945,906 A | * | 8/1999 | Onuma | 340/425.5 |
| 6,025,783 A | * | 2/2000 | Steffens, Jr. | 340/644 |
| 6,239,701 B1 | * | 5/2001 | Vasquez et al. | 340/539 |

* cited by examiner

*Primary Examiner*—Tan Ho

(57) ABSTRACT

A combined battery holder and antenna is utilized into a remote signaling device, or keyfob for a vehicle. The battery holder receives the battery at an inner peripheral surface of a bobbin body. The coil antenna is wound about the outer peripheral surface of the bobbin body. In this way, the single part can provide both functions. This reduces the required space necessary for providing all functions within the keyfob.

5 Claims, 2 Drawing Sheets

COMBINATION BATTERY HOLDER AND ANTENNA FOR KEYFOB

This application claims priority to provisional Patent Application Ser. No. 60/186,174 filed Mar. 1, 2000.

BACKGROUND OF THE INVENTION

This invention relates to a combination battery holder and antenna for a remote signaling device wherein the outer peripheral surface of the battery holder is used as a bobbin for winding the antenna.

Modern vehicles are typically provided with a control that can receive remote signals such as from a remote keyless entry system. The vehicle has a transmitter/ receiver capable of receiving coded instructions from the remote signaling device, and then actuating components on the vehicle if the signals are appropriate.

Such remote signaling devices are known as keyfobs, and will typically include switches for locking the door, unlocking the door, unlocking the trunk, etc. Keyfobs have several competing challenges with regard to design and packaging. Most desirably, the keyfob should not be too large. The keyfob is typically carried in a purse or a user's pocket, and thus it is desirable to have it be as small as possible. On the other hand, the keyfob must house a battery and an antenna which is part of the transmitter/receiver. Further, as more components are being controlled by such remote signaling devices, more switches are being incorporated into the keyfob. All of the above factors combine to make the production of a relatively small keyfob which still provides all of the desired functional characteristics a significant challenge.

SUMMARY OF THE INVENTION

In the disclosed embodiment of this invention, a component for holding the battery onto a circuit board further provides the antenna for the transmitter/receiver. In a preferred embodiment, the battery holder receives the battery at an inner peripheral surface, and the outer peripheral surface of the battery holder provides a bobbin for the antenna. The antenna is wound around this outer periphery. The combined antenna and battery holder may then be plugged into the circuit board and connected in any number of ways. The use of the single component to provide both functions results in significant reduction in cost and assembly complexity for the keyfob. Perhaps most importantly, the use of the combined component reduces the required space inside the keyfob, thus allowing the keyfob to be made relatively small.

These and other features of the present invention can be best understood from the following specification and drawings, the following of which is a brief description.

DETAILED DESCRIPTION OF A PREFERRED EMBODIMENT

Figure 1:
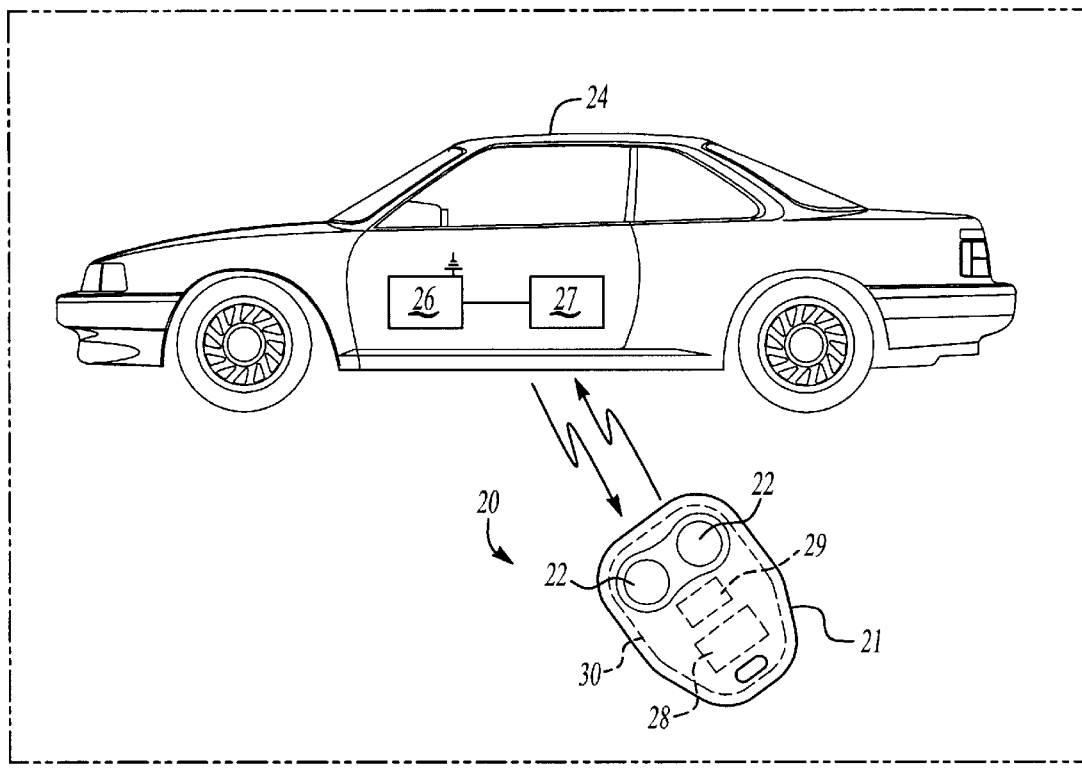
FIG. 1 shows a prior art keyfob assembly.

A system 20 is illustrated in FIG. 1, and is as known in the art. A keyfob 21 incorporates a number of switches 22 which transmit signals to a remote vehicle 24. The signals are transmitted from a transmitter/receiver 28, and are received by a receiver/transmitter 26 on the vehicle. If the signal received from the keyfob indicates that the keyfob is appropriate for the particular vehicle 24, then the component 27 may be actuated by a control associated with the receiver/transmitter 26. The receiver/transmitter 26 will also send signals back to the keyfob. Thus, the keyfob must be provided with the ability to receive signals, which in turn requires an antenna 30 incorporated into the keyfob 21. The size of the antenna is directly related to the range of distance between the keyfob and the vehicle for sending and receiving appropriate signals.

One limitation with this prior art system is that a battery holder 29 and the antenna 30 are formed as separate items, requiring a relatively large amount of space.

Figure 2:
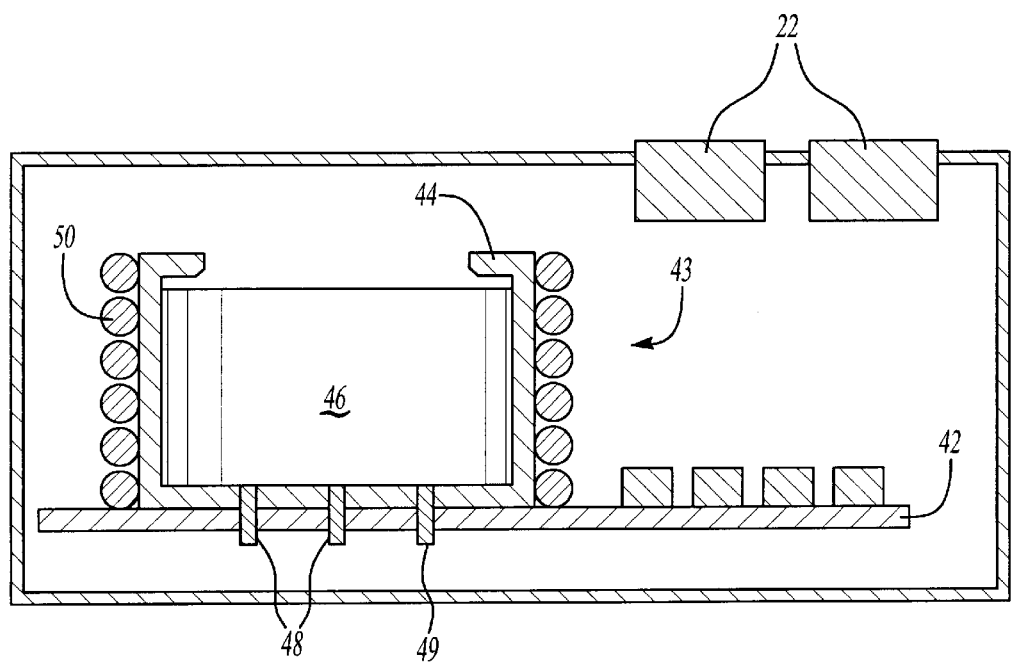
FIG. 2 is a cross-sectional view through the inventive keyfob.

FIG. 2 shows an inventive keyfob 40 having a circuit board 42 receiving a battery holder/antenna combination 43. As shown, a bobbin body 44 receives the battery 46 at an inner peripheral surface. As is known, the battery 46 is removable, such that it may be replaced by a user of the keyfob 40. Connections 48 and 49 connect the battery 46 to the circuit board 42. A connection 49 communicates with a coil antenna 50 which is wound on the outer periphery of the bobbin 44.

Figure 3:
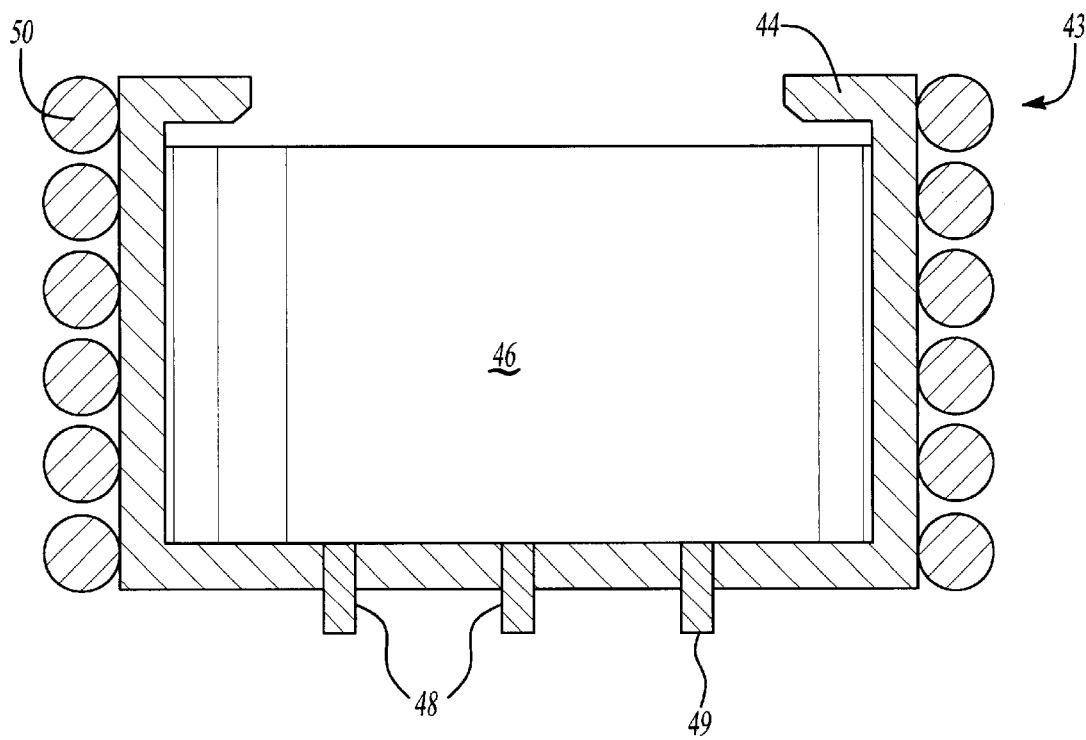
FIG. 3 shows a portion of the inventive keyfob.

As shown in FIG. 3, the body 44 receives the antenna 50 on the outer periphery. The battery 46 is received inside the bobbin 44, which preferably allows the battery 46 to snap in and out. A worker in this art would recognize how to form the bobbin 44 such that the battery will be securely retained, but would be removable by a user for replacement of the battery.

The connections 48 and 49 are connected to the circuit board 42, either by soldering, welding, or other methods. The way of the attaching the combined antenna and battery holder to the circuit board 42 forms no portion of this invention. It is the use of the combined part which is inventive here.

Figure 4:
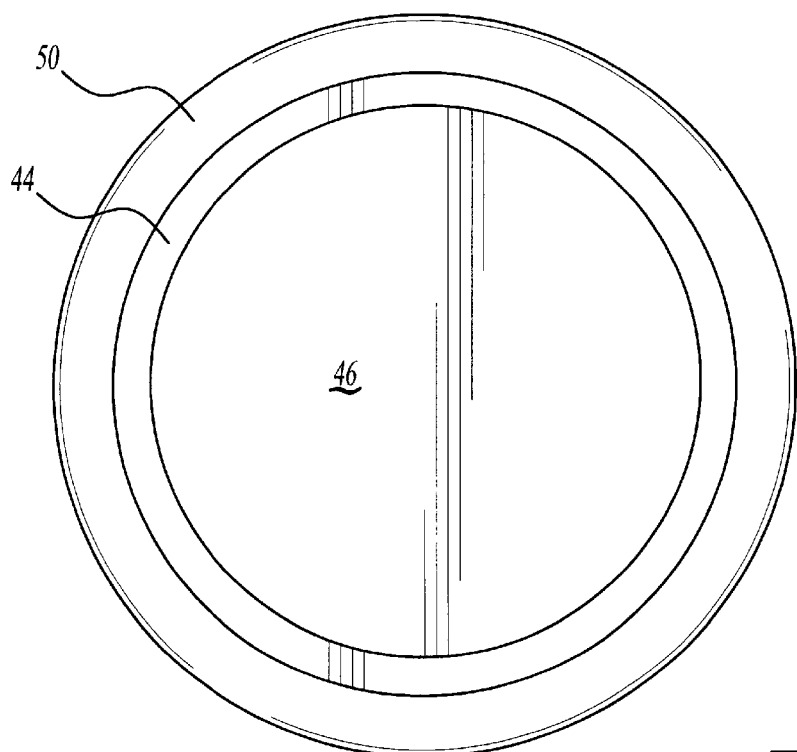
FIG. 4 shows a top view of the combined battery holder and antenna.

As shown in FIG. 4, bobbin 44 is cylindrical and receives the antenna 50 in a coil above the outer peripheral surface.

The combination of the battery holder and antenna provides two necessary functions in a single component, thus reducing required space.

Although a preferred embodiment of this invention has been disclosed, a worker in this art would recognize that modifications would come within the scope of this invention. For that reason, the following claims should be studied to determine the true scope and content of this invention.

What is claimed is:

1. A remote signaling device for actuating components on a vehicle comprising:
   a body including switches for sending a signal to the vehicle to request actuation of components on the vehicle, said switches communicating with a circuit board;
   a transmitter/receiver for sending signals to and receiving signals from the vehicle; and
   a combined battery holder and antenna connected to said circuit board, said battery holder receiving a battery, and said antenna communicating with said transmitter/receiver, said battery being removably held on said circuit board by said battery holder, and said antenna being connected to said battery holder, said body fully enclosing said battery, said battery and said antenna.

2. A remote signaling device for actuating components on a vehicle comprising:

a body including switches for sending a signal to the vehicle to request actuation of components on the vehicle, said switches communicating with a circuit board;

a transmitter/receiver for sending signals to and receiving signals from the vehicle;

a combined battery holder and antenna connected to said circuit board, said battery holder receiving a battery, and said antenna communicating with said transmitter/receiver; and said battery holder has an inner peripheral surface which receives said battery, and an outer peripheral surface about which said antenna is wound.

3. A signaling device as set forth in claim 2, wherein said combined battery holder and antenna has a plurality of connections which plug into openings in said circuit board.

4. A remote signaling device for actuating components on a vehicle comprising:

a body including switches for sending a signal to the vehicle to request actuation of components on the vehicle, said switches communicating with a circuit board;

a transmitter/receiver for sending signals to and receiving signals from the vehicle;

a combined battery holder and antenna connected to said circuit board, said battery holder receiving a battery, and said antenna communicating with said transmitter/receiver; and said combined battery holder and antenna is relatively cylindrical, with said antenna being a coil wound on an outer peripheral cylindrical surface of said battery holder.

5. A remote signaling device for actuating components on a vehicle comprising:

a body including switches for sending a signal to the vehicle to request actuation of components on the vehicle, said switches communicating with a circuit board;

a transmitter/receiver for sending signals to and receiving signals from the vehicle; and a combined battery holder and antenna connected to said circuit board, said battery holder receiving a battery, and said antenna communicating with said transmitter/receiver, said battery holder having an inner peripheral surface receiving said battery and an outer peripheral surface with said antenna wound about said outer peripheral surface, said battery holder and said antenna both being relatively cylindrical, and said combined battery holder and antenna connecting into said circuit board.

* * * * *